(12) United States Patent
Lau et al.

(10) Patent No.: US 12,727,517 B2
(45) Date of Patent: Sep. 1, 2026

(54) CHIP PACKAGE STRUCTURE AND MANUFACTURING METHOD THEREOF

(71) Applicant: Unimicron Technology Corp., Taoyuan City (TW)

(72) Inventors: John Hon-Shing Lau, Taoyuan City (TW); Tzyy-Jang Tseng, Taoyuan City (TW)

(73) Assignee: Unimicron Technology Corp., Taoyuan City (TW)

( * ) Notice: Subject to any disclaimer, the term of this patent is extended or adjusted under 35 U.S.C. 154(b) by 364 days.

(21) Appl. No.: 18/486,172

(22) Filed: Oct. 13, 2023

(65) Prior Publication Data

US 2025/0125298 A1 Apr. 17, 2025

(51) Int. Cl.
*H10W 90/00* (2026.01)
*H10W 70/60* (2026.01)
(Continued)

(52) U.S. Cl.
CPC .......... *H10W 90/00* (2026.01); *H10W 70/611* (2026.01); *H10W 70/614* (2026.01);
(Continued)

(58) Field of Classification Search
CPC . H10W 90/297; H10W 90/00; H10W 70/635; H10W 70/614; H10W 70/611; H10W 90/26; H10W 70/093; H10W 70/60; H10W 90/736; H10W 90/792; H10W 90/20; H10W 90/22; H10W 90/231;
(Continued)

(56) References Cited

U.S. PATENT DOCUMENTS 11,217,563 B2 1/2022 Zhai
11,688,681 B2 6/2023 Chen
2021/0134748 A1* 5/2021 Liu ...................... H10W 20/20

FOREIGN PATENT DOCUMENTS

WO WO-2023179088 A1 * 9/2023 ........ H10W 72/0198

OTHER PUBLICATIONS

Boettcher, L. et al., Implementation of Chip Embedding Processes for the Creation of Miniaturized System-In-Packages, 2010, IEEE, pp. 1-6 (Year: 2010).*

(Continued)

*Primary Examiner* — Caleen O Sullivan
*Assistant Examiner* — Brett Squires
(74) *Attorney, Agent, or Firm* — JCIPRNET

(57) ABSTRACT

A chip package structure includes a first chip, a second chip, a plurality of first hybrid bonding pads, a first insulating layer, a first patterned conductive layer, a second patterned conductive layer, and a plurality of first conductive via structures and second conductive via structures. The first chip is electrically connected to the second chip through a plurality of first through silicon vias. The first chip is bonded onto the second chip through the first hybrid bonding pads. The first insulating layer covers the first and the second chips. The first and the second patterned conductive layers are respectively disposed on a first upper surface and a first lower surface of the first insulating layer. The first conductive via structures are electrically connected to the first and the second patterned conductive layers. The second conductive via structures are electrically connected to the first chip and the first patterned conductive layer.

8 Claims, 6 Drawing Sheets

(51) Int. Cl.
*H10W 70/63* (2026.01)
*H10W 70/05* (2026.01)
*H10W 90/20* (2026.01)
*H10W 90/26* (2026.01)

(52) U.S. Cl.
CPC ........ *H10W 70/635* (2026.01); *H10W 70/093* (2026.01); *H10W 70/60* (2026.01); *H10W 90/26* (2026.01); *H10W 90/297* (2026.01); *H10W 90/736* (2026.01); *H10W 90/792* (2026.01)

(58) Field of Classification Search
CPC . H10W 90/24; H10W 90/271; H10W 90/275; H10W 90/28; H10W 90/284; H10W 90/288; H10W 90/291; H10W 90/293; H10W 90/295; H01L 24/24; H01L 23/5389; H01L 23/5384; H05K 2201/0358
See application file for complete search history.

(56) References Cited

OTHER PUBLICATIONS

Dionysios Manessis et al., "Technical Understanding of Resin-Coated-Copper (RCC) Lamination Processes for Realization of Reliable Chip Embedding Technologies", Proceedings—Electronic Components and Technology Conference, May 2007, pp. 278-285.

* cited by examiner

CHIP PACKAGE STRUCTURE AND MANUFACTURING METHOD THEREOF

BACKGROUND

Technical Field

The disclosure relates to a package structure and a manufacturing method thereof, specifically to a chip package structure and a manufacturing method thereof.

Description of Related Art

Over the past few years, artificial intelligence (AI) and 5G/6G technologies have provided impetus to the widespread use of high-performance computing (HPC) in advanced network and server applications, especially in AI-related products that demand high data rate, increasing bandwidth, and reducing latency. However, current build-up package substrates hardly meet the above demand. This is because there is only one chip embedded in a build-up structure, and the requirements of high density and high performance are hard to meet.

SUMMARY

The disclosure provides a chip package structure which has advantages such as a very low profile, low cost, high density, and high performance.

The disclosure further provides a manufacturing method of a chip package structure which is adapted for manufacturing the chip package structure mentioned above.

The chip package structure of the disclosure includes a first chip, a second chip, a plurality of first hybrid bonding pads, a first insulating layer, a first patterned conductive layer, a second patterned conductive layer, a plurality of first conductive via structures, and a plurality of second conductive via structures. The first chip has a plurality of first through silicon vias (TSVs). The second chip is directly disposed on the first chip, in which the first chip is electrically connected to the second chip through the first through silicon vias. The first hybrid bonding pads are formed between the first chip and the second chip. The first chip is bonded onto the second chip through the first hybrid bonding pads. The first insulating layer covers the first chip and the second chip, and has a first upper surface and a first lower surface opposite to each other. The first patterned conductive layer is disposed on the first upper surface of the first insulating layer. The second patterned conductive layer is disposed on the first lower surface of the first insulating layer. The first conductive via structures pass through the first insulating layer and are electrically connected to the first patterned conductive layer and the second patterned conductive layer. The second conductive via structures are disposed inside the first insulating layer and electrically connected to the first chip and the first patterned conductive layer.

In an embodiment of the disclosure, the first chip has a first surface, the second chip has a second surface, and the first surface directly contacts the second surface.

In an embodiment of the disclosure, the chip package structure further includes a build-up structure and a core substrate. The core substrate includes a core layer and a plurality of third conductive via structures. The core layer is disposed between the build-up structure and the second patterned conductive layer. The third conductive via structures pass through the core layer and are electrically connected to the build-up structure and the second patterned conductive layer.

In an embodiment of the disclosure, the build-up structure includes a third chip, a fourth chip, a plurality of second hybrid bonding pads, a second insulating layer, a third patterned conductive layer, a fourth patterned conductive layer, a plurality of fourth conductive via structures, and a plurality of fifth conductive via structures. The third chip has a plurality of second through silicon vias. The fourth chip is directly disposed on the third chip, in which the third chip is electrically connected to the fourth chip through the second through silicon vias. The second hybrid bonding pads are formed between the third chip and the fourth chip. The third chip is bonded onto the fourth chip through the second hybrid bonding pads. The second insulating layer covers the third chip and the fourth chip, and has a second upper surface and a second lower surface opposite to each other. The third patterned conductive layer is disposed on the second upper surface of the second insulating layer. The fourth patterned conductive layer is disposed on the second lower surface of the second insulating layer and directly contacts the core layer. The third conductive via structures are electrically connected to the second patterned conductive layer and the fourth patterned conductive layer. The fourth conductive via structures pass through the second insulating layer and are electrically connected to the third patterned conductive layer and the fourth patterned conductive layer. The fifth conductive via structures are disposed inside the second insulating layer and are electrically connected to the third chip and the third patterned conductive layer.

In an embodiment of the disclosure, the build-up structure includes the second insulating layer, a first patterned circuit layer, a second patterned circuit layer, a third patterned circuit layer, the plurality of fourth conductive via structures, the plurality of fifth conductive via structures, and a plurality of sixth conductive via structures. The second insulating layer has the second upper surface and the second lower surface opposite to each other. The first patterned circuit layer is disposed on the second upper surface of the second insulating layer and directly contacts the core layer. The third conductive via structures are electrically connected to the second patterned conductive layer and the first patterned circuit layer. The second patterned circuit layer is disposed inside the second insulating layer. The third patterned circuit layer is disposed on the second lower surface of the second insulating layer. The fourth conductive via structures are disposed inside the second insulating layer and are electrically connected to the first patterned circuit layer and the second patterned circuit layer. The fifth conductive via structures are disposed inside the second insulating layer and are electrically connected to the second patterned circuit layer and the third patterned circuit layer. The sixth conductive via structures are disposed inside the second insulating layer and are electrically connected to the first patterned circuit layer and the third patterned circuit layer.

In an embodiment of the disclosure, a thickness of the core substrate is greater than a thickness of the build-up structure.

In an embodiment of the disclosure, the chip package structure further includes a die attach film (DAF) disposed between the second chip and the second patterned conductive layer. The second chip is fixed onto the second patterned conductive layer through the die attach film.

The manufacturing method of a chip package structure of the disclosure includes the following steps. A first chip and a second chip are provided. The first chip has a plurality of first through silicon vias. A plurality of first hybrid bonding pads are formed between the first chip and the second chip. The first chip is bonded to the second chip through the first hybrid bonding pads, in which the first chip is electrically connected to the second chip through the first through silicon vias. The first chip and the second chip are bonded onto a first metal layer. A second metal layer and a first insulating layer located on the second metal layer are provided. The second metal layer and the first insulating layer are press-fitted onto the first metal layer. The first chip and the second chip are covered by the first insulating layer, in which the first insulating layer has a first upper surface and a first lower surface opposite to each other. A drilling process is conducted to form a plurality of first openings that pass through the second metal layer and the first insulating layer and expose a portion of the first metal layer and a plurality of second openings that pass through the second metal layer and a portion of the first insulating layer and expose a portion of the first chip. A first patterned conductive layer is formed on the first upper surface of the first insulating layer. A second patterned conductive layer is formed on the first lower surface of the first insulating layer. A plurality of first conductive via structures are formed inside the first openings. The first conductive via structures are electrically connected to the first patterned conductive layer and the second patterned conductive layer. A plurality of second conductive via structures are formed inside the second openings. The second conductive via structures are electrically connected to the first chip and the first patterned conductive layer.

In an embodiment of the disclosure, the manufacturing method of a chip package structure further includes the following. A die attach film is formed on the first metal layer before the first chip and the second chip are bonded onto the first metal layer. The second chip is fixed onto the first metal layer through the die attach film.

In an embodiment of the disclosure, the manufacturing method of a chip package structure further includes the following. A build-up structure is provided. A core substrate is provided. The core substrate includes a core layer and a plurality of third conductive via structures that pass through the core layer. The build-up structure and the second patterned conductive layer are bonded onto the core substrate. The core layer is disposed between the build-up structure and the second patterned conductive layer. The third conductive via structures are electrically connected to the build-up structure and the second patterned conductive layer.

In light of the foregoing, in the design of the chip package structure of the disclosure, the first chip is electrically connected to the second chip through the first through silicon via, the first chip is bonded onto the second chip through the first hybrid bonding pad, and the first insulating layer covers the first chip and the second chip. In other words, a bumpless state is achieved between the first chip and the second chip. The first chip and the second chip are embedded in the first insulating layer. Therefore, the chip package structure of the disclosure may have a very low profile, relatively low cost, relatively high density, and relatively high performance.

To make the above features and advantages of the disclosure more comprehensible, embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
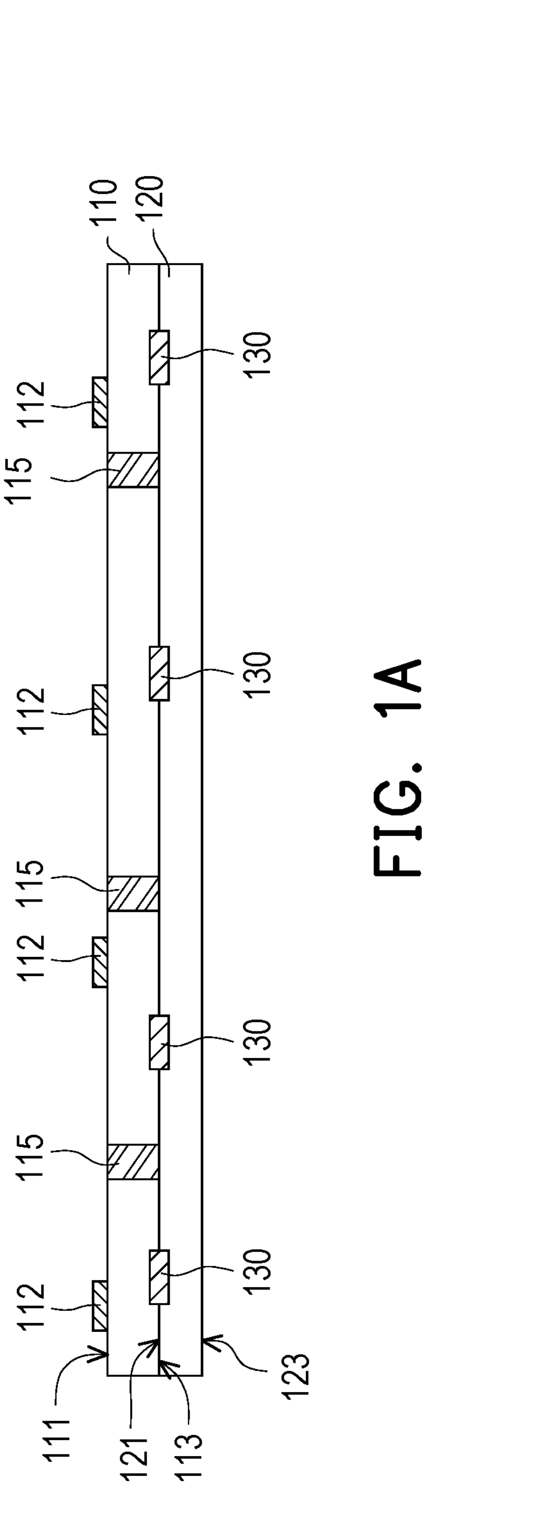
FIGS. 1A through 1E are schematic cross-sectional views illustrating a manufacturing method of a chip package structure according to one embodiment of the disclosure.

Embodiments of the disclosure will be understood through the accompanying drawings, and the drawings are deemed as a part of the description of the disclosure. It is to be understood that the drawings of the disclosure are not drawn to scale. In fact, components may be arbitrarily enlarged or reduced in size in order to clearly show the features of the disclosure.

FIGS. 1A through 1E are schematic cross-sectional views illustrating a manufacturing method of a chip package structure according to an embodiment of the disclosure. Based on the manufacturing method of a chip package structure of this embodiment, firstly, refer to FIG. 1A, a first chip 110 and a second chip 120 are provided. The first chip 110 includes a plurality of bonding pads 112, and has a first upper surface 111 and a first lower surface 113 opposite to each other and a plurality of first through silicon vias 115. The bonding pad 112 is disposed on the upper surface 111. The first through silicon vias 115 are separated from each other, pass through the first chip 110 and connect the upper surface 111 and the lower surface 113. The second chip 120 has an upper surface 121 and a lower surface 123 opposite to each other. The first chip 110 and the second chip 120 may each be a logic chip, a memory chip, a chiplet, or other System on a Chip (SOC), yet not limited thereto.

Next, refer to FIG. 1A again, a plurality of first hybrid bonding pads 130 are formed between the first chip 110 and the second chip 120. The first chip 110 is bonded onto the second chip 120 through the first hybrid bonding pads 130, and the first chip 110 is electrically connected to the second chip 120 through the first through silicon vias 115. The first hybrid bonding pad 130 is formed by $SiO_2$-to-$SiO_2$ bonding at room temperature and metal-to-metal bonding during annealing. For example, a metal pad on the first chip 110 is directly bonded to a metal pad on the second chip 120. That is, a bumpless state is achieved between the first chip 110 and the second chip 120. The lower surface 113 (that is, a first surface) of the first chip 110 directly contacts the upper surface 121 (that is, a second surface) of the second chip 120. In other words, the first chip 110 is directly disposed on and directly contacts the second chip 120, and an edge of the first chip 110 is, for example, aligned with an edge of the second chip 120. In an embodiment, an orthographic projection of the bonding pad 112 of the first chip 110 on the second chip 120, for example, partially overlaps the first hybrid bonding pad 130 and/or does not overlap the first hybrid bonding pad 130.

Figure 1B:
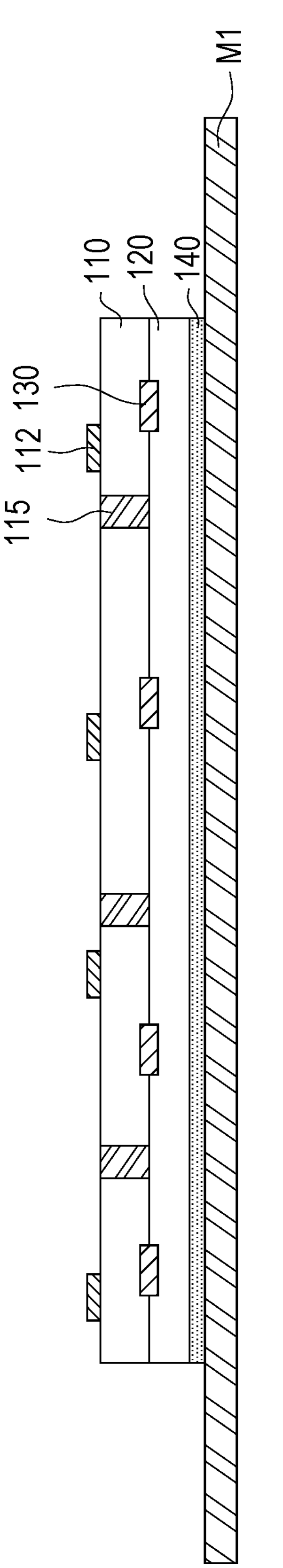

Next, refer to FIG. 1B, a first metal layer M1 and a die attach film 140 disposed on the first metal layer M1 are provided. The first metal layer M1 is, for example, copper foil, yet is not limited thereto. The first metal layer M1 is, for example, larger in size than the die attach film 140.

Next, refer to FIG. 1B again, the first chip 110 and the second chip 120 are bonded onto the first metal layer M1, in which the second chip 120 is fixed onto the first metal layer M1 through the die attach film 140. An edge of the die attach film 140 is aligned with an edge of the second chip 120 and an edge of the first chip 110.

Figure 1C:
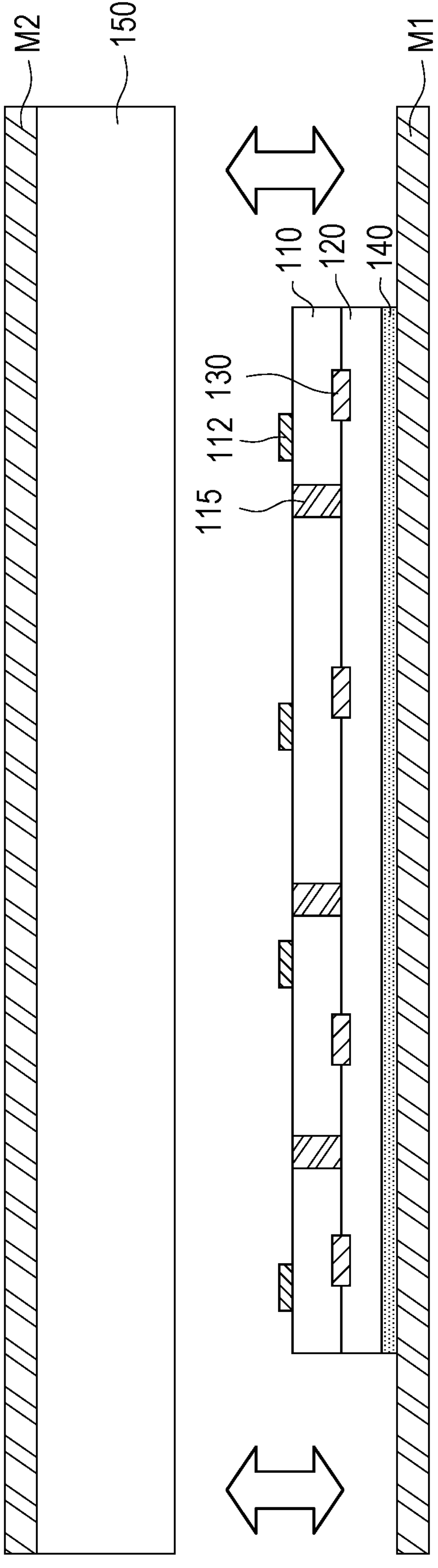

Next, refer to FIG. 1C, a second metal layer M2 and a first insulating layer 150 located on the second metal layer M2 are provided. The second metal layer M2 is, for example, copper foil, yet is not limited thereto. An edge of the second metal layer M2 is, for example, aligned with an edge of the first insulating layer 150. A thickness of the first insulating layer 150 is, for example, greater than a thickness of the second metal layer M2.

Figure 1D:
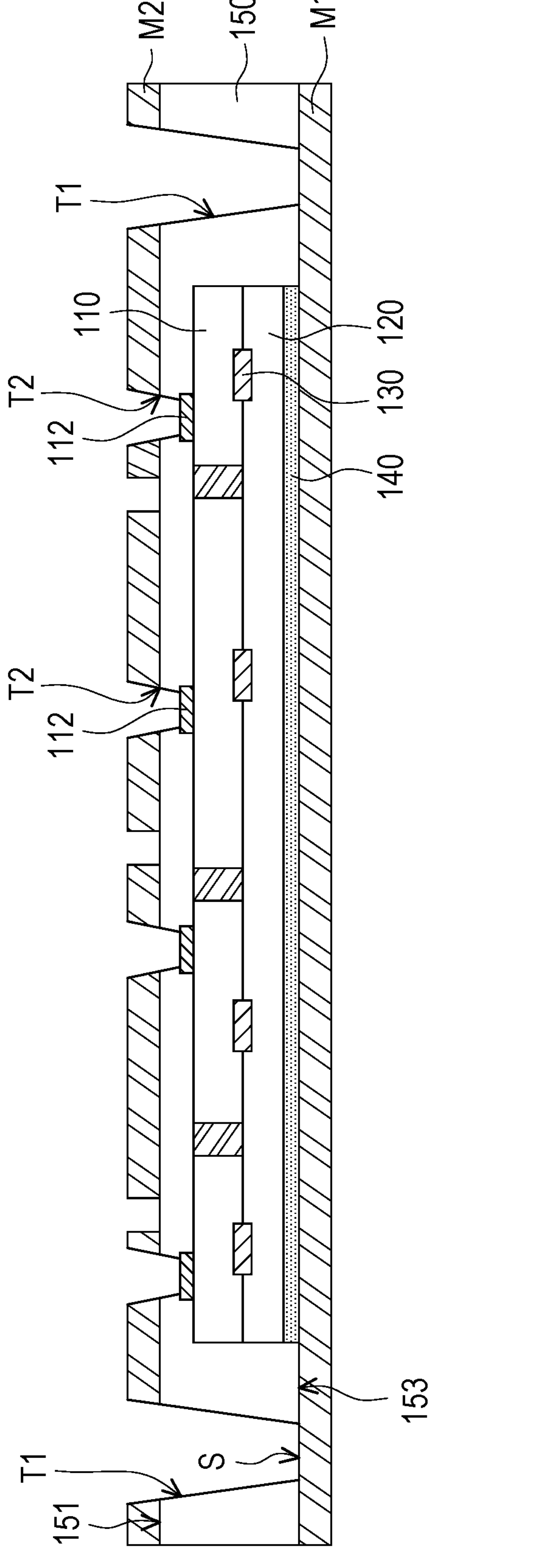

Next, refer to FIG. 1C and FIG. 1D together, the second metal layer M2 and the first insulating layer 150 are press-fitted onto the first metal layer M1 by thermocompression bonding, in which the first insulating layer 150 is located between the first metal layer M1 and the second metal layer M2 and the first insulating layer 150 covers the first chip 110 and the second chip 120. In other words, the first chip 110 and the second chip 120 are embedded in the first insulating layer 150, i.e., the first chip 110 and the second chip 120 are surrounded by the first insulating layer 150. The first insulating layer 150 has a first upper surface 151 and a first lower surface 153 opposite to each other.

Refer to FIG. 1D again, a drilling process such as laser drilling or mechanical drilling is conducted to form a plurality of first openings T1 that pass through the second metal layer M2 and the first insulating layer 150 and expose a portion of the first metal layer M1 and a plurality of second openings T2 that pass through the second metal layer M2 and a portion of the first insulating layer 150 and expose a portion of the first chip 110. The first opening T1 exposes a portion of a surface S of the first metal layer M1, and the second opening T2 exposes the bonding pad 112 of the first chip 110.

Figure 1E:
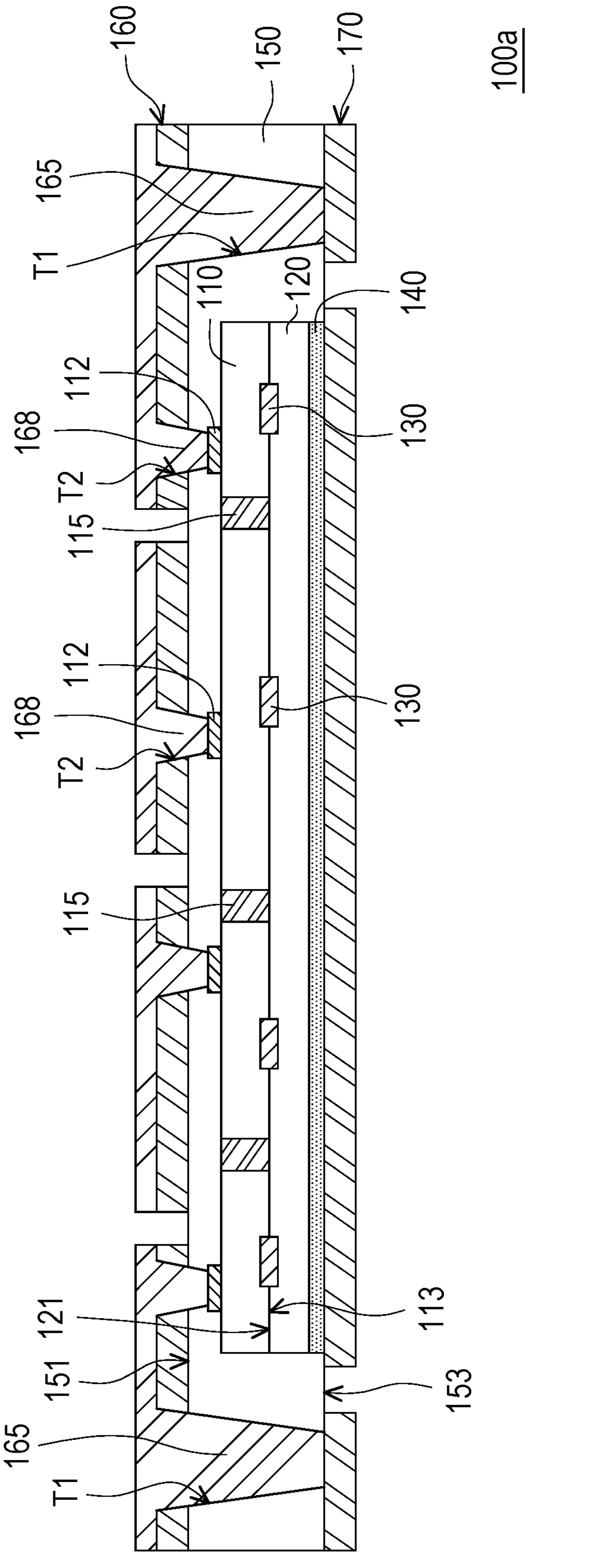

Next, refer to FIG. 1D and FIG. 1E together, a first patterned conductive layer 160 is formed on the first upper surface 151 of the first insulating layer 150. A second patterned conductive layer 170 is formed on the first lower surface 153 of the first insulating layer 150. A plurality of first conductive via structures 165 are formed in the first openings T1. A plurality of second conductive via structures 168 are formed in the second openings T2.

More specifically, a metal material layer is formed on the first upper surface 151 of the first insulating layer 150 by electroplating, in which the metal material layer covers the second metal layer M2 and fills up the first opening T1 and the second opening T2 to form the first conductive via structure 165 in the first opening T1 and the second conductive via structure 168 in the second opening T2. Next, the metal material layer and the second metal layer M2 below the metal material layer are subjected to a patterning process to form the first patterned conductive layer 160 on the first upper surface 151 of the first insulating layer 150. The first metal layer M1 is subjected to a patterning process to form the second patterned conductive layer 170 on the first lower surface 153 of the first insulating layer 150. The patterning process is, for example, an etching process. The first conductive via structure 165 is electrically connected to the first patterned conductive layer 160 and the second patterned conductive layer 170. The second conductive via structure 168 is electrically connected to the bonding pad 112 of the first chip 110 and the first patterned conductive layer 160. Up to this point, manufacturing of a chip package structure 100*a* is completed.

In terms of structure, please refer to FIG. 1E again. In this embodiment, the chip package structure 100*a* includes the first chip 110, the second chip 120, the first hybrid bonding pad 130, the first insulating layer 150, the first patterned conductive layer 160, the second patterned conductive layer 170, the first conductive via structure 165, and the second conductive via structure 168. The first chip 110 has the first through silicon via 115. The second chip 120 is directly disposed on the first chip 110, in which the first chip 110 is electrically connected to the second chip 120 through the first through silicon via 115. The first hybrid bonding pad 130 is formed between the first chip 110 and the second chip 120, in which the first chip 110 is bonded onto the second chip 120 through the first hybrid bonding pad 130. The first insulating layer 150 covers the first chip 110 and the second chip 120, and has the first upper surface 151 and the first lower surface 153 opposite to each other. The first patterned conductive layer 160 is disposed on the first upper surface 151 of the first insulating layer 150. The second patterned conductive layer 170 is disposed on the first lower surface 153 of the first insulating layer 150. The first conductive via structure 165 passes through the first insulating layer 150 and is electrically connected to the first patterned conductive layer 160 and the second patterned conductive layer 170. The second conductive via structure 168 is disposed inside the first insulating layer 150 and electrically connected to the first chip 110 and the first patterned conductive layer 160. The chip package structure 100*a* in this embodiment further includes the die attach film 140 disposed between the second chip 120 and the second patterned conductive layer 170, in which the second chip 120 is fixed onto the second patterned conductive layer 170 through the die attach film 140.

The first chip 110 in this embodiment is electrically connected to the second chip 120 through the first through silicon via 115. The first chip 110 is bonded onto the second chip 120 through the first hybrid bonding pad 130, and the first insulating layer 150 covers the first chip 110 and the second chip 120. In other words, a bumpless state is achieved between the first chip 110 and the second chip 120. The first chip 110 and the second chip 120 are embedded in the first insulating layer 150. Therefore, the chip package structure 100*a* in this embodiment may have a very low profile, relatively low cost, relatively high density, and relatively high performance.

Other embodiments are elaborated on as follows. It should be noted that the reference numerals and a part of the contents in the previous embodiment are used in the following embodiments, in which identical reference numerals denote identical or similar components, and repeated description of the same technical contents is omitted. For a description of the omitted parts, reference can be found in the aforementioned embodiments, and no repeated description is given in the following embodiments.

Figure 2:
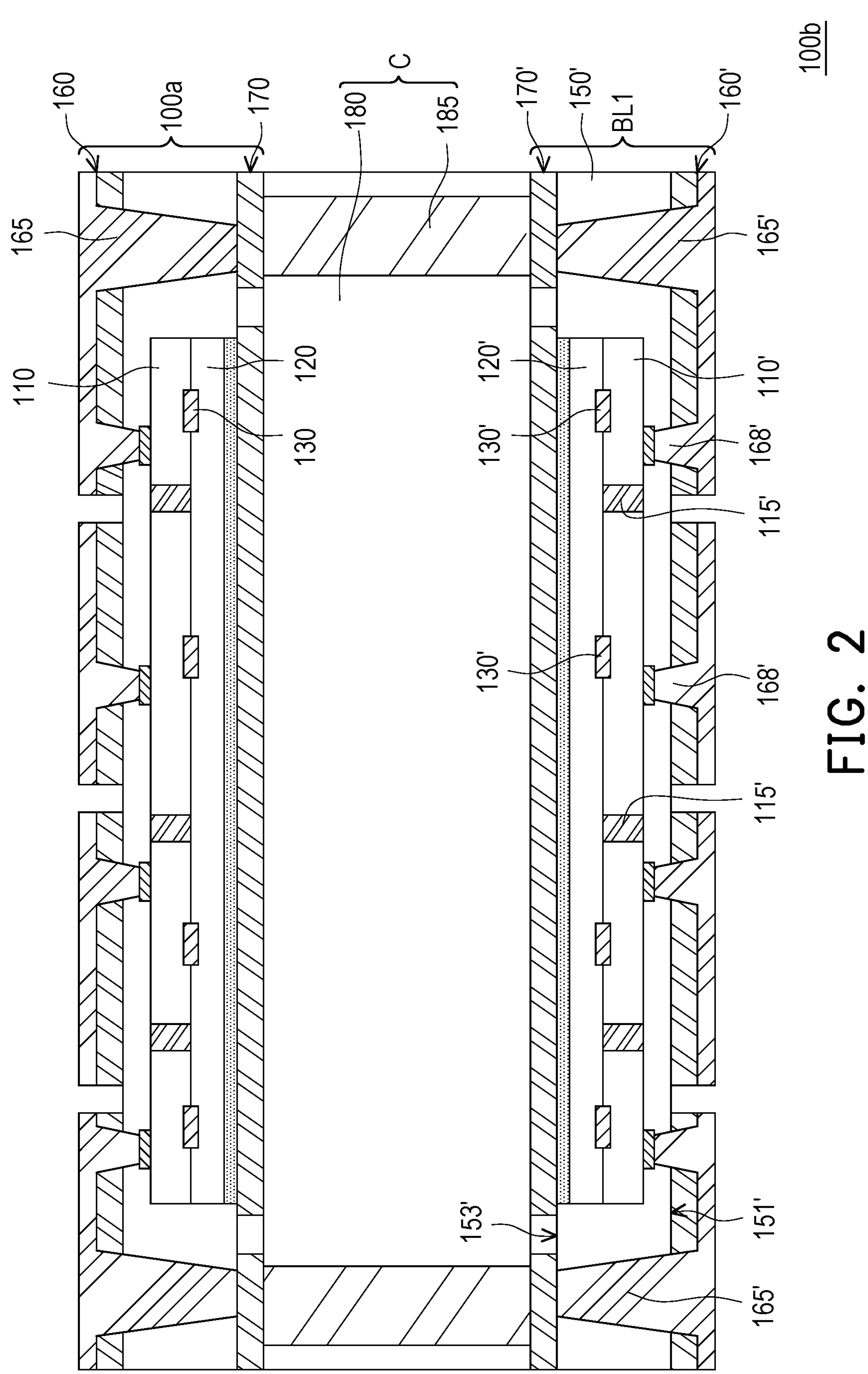
FIG. 2 is a schematic cross-sectional view illustrating a chip package structure according to one embodiment of the disclosure.

FIG. 2 is a schematic cross-sectional view illustrating a chip package structure according to one embodiment of the disclosure. Please refer to FIG. 1E and FIG. 2 together. A chip package structure 100*b* in this embodiment is similar to the chip package structure 100*a*. The major difference is that the chip package structure 100*b* in this embodiment further includes a build-up structure BL1 and a core substrate C. The core substrate C includes a core layer 180 and a plurality of third conductive via structures 185. The core layer 180 is disposed between the build-up structure BL1 and the second patterned conductive layer 170. The third conductive via structures 185 pass through the core layer 180 and are electrically connected to the build-up structure BL1 and the second patterned conductive layer 170. A thickness of the core substrate C is, for example, greater than a thickness of the build-up structure BL1, yet is not limited thereto.

More specifically, please refer to FIG. 2 again. In this embodiment, the build-up structure BL1 includes a third chip 110', a fourth chip 120', a plurality of second hybrid bonding pads 130', a second insulating layer 150', a third patterned conductive layer 160', a fourth patterned conductive layer 170', a plurality of fourth conductive via structures 165', and a plurality of fifth conductive via structures 168'. The third chip 110' has a plurality of second through silicon vias 115'. The fourth chip 120' is directly disposed on the third chip 110', in which the third chip 110' is electrically connected to the fourth chip 120' through the second through silicon vias 115'. The second hybrid bonding pads 130' are formed between the third chip 110' and the fourth chip 120', in which the third chip 110' is bonded onto the fourth chip 120' through the second hybrid bonding pads 130'. The second insulating layer 150' covers the third chip 110' and the fourth chip 120', and has a second upper surface 151' and a second lower surface 153' opposite to each other. The third patterned conductive layer 160' is disposed on the second upper surface 151' of the second insulating layer 150'. The fourth patterned conductive layer 170' is disposed on the second lower surface 153' of the second insulating layer 150' and directly contacts the core layer 180. The third conductive via structures 185 are electrically connected to the second patterned conductive layer 170 and the fourth patterned conductive layer 170'. The fourth conductive via structures 165' pass through the second insulating layer 150' and are electrically connected to the third patterned conductive layer 160' and the fourth patterned conductive layer 170'. The fifth conductive via structures 168' are disposed inside the second insulating layer 150' and electrically connected to the third chip 110' and the third patterned conductive layer 160'. The build-up structure BL1 is embodied in the same way as the chip package structure 100*a* illustrated in FIG. 1. In other words, the build-up structure BL1 is a structure layer in which a plurality of hybrid bonded chips are embedded.

In terms of manufacturing process, please refer to FIG. 1E and FIG. 2 together. After manufacturing of the chip package structure 100*a* illustrated in FIG. 1E is completed, the same structure may further be provided to serve as the build-up structure BL1. Then, the core substrate C is provided. The core substrate C includes the core layer 180 and the third conductive via structure 185 that passes through the core layer 180. Lastly, the build-up structure BL1 and the second patterned conductive layer 170 are bonded onto the core substrate C, in which the core layer 180 is disposed between the build-up structure BL1 and the second patterned conductive layer 170, and the third conductive via structure 185 is electrically connected to the build-up structure BL1 and the second patterned conductive layer 170. Up to this point, manufacturing of the chip package structure 100*b* is completed.

Figure 3:
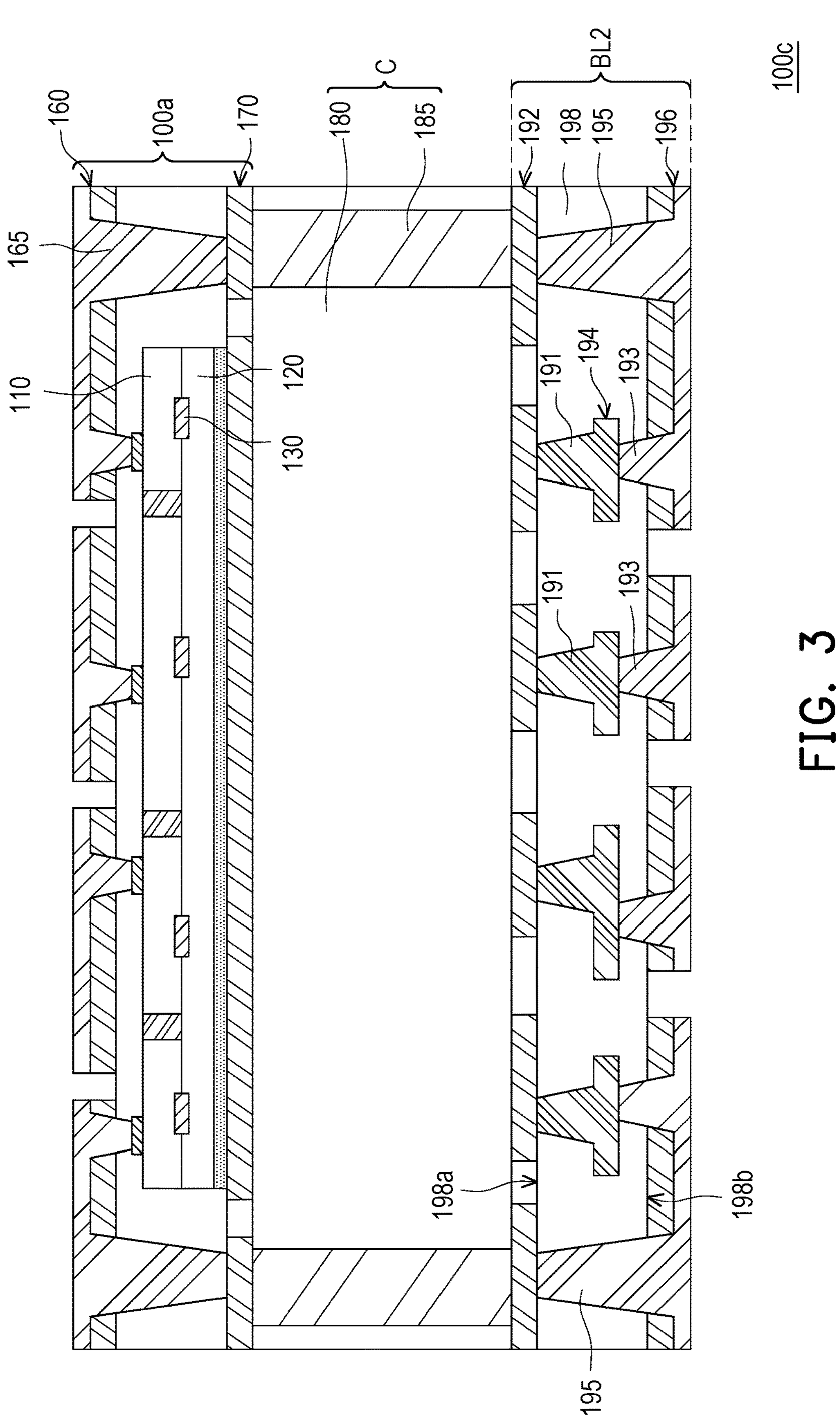
FIG. 3 is a schematic cross-sectional view illustrating a chip package structure according to another embodiment of the disclosure.

FIG. 3 is a schematic cross-sectional view illustrating a chip package structure according to another embodiment of the disclosure. Please refer to FIG. 1E and FIG. 3 together. A chip package structure 100*c* in this embodiment is similar to the chip package structure 100*a*. The major difference is that the chip package structure 100*c* in this embodiment further includes a build-up structure BL2 and the core substrate C. The core substrate C includes the core layer 180 and the plurality of third conductive via structures 185. The core layer 180 is disposed between the build-up structure BL2 and the second patterned conductive layer 170. The third conductive via structures 185 pass through the core layer 180 and are electrically connected to the build-up structure BL2 and the second patterned conductive layer 170. A thickness of the core substrate C is, for example, greater than a thickness of the build-up structure BL2, yet is not limited thereto.

More specifically, please refer to FIG. 3 again. In this embodiment, the build-up structure BL2 includes a first patterned circuit layer 192, a second patterned circuit layer 194, a third patterned circuit layer 196, a second insulating layer 198, a plurality of fourth conductive via structures 191, a plurality of fifth conductive via structures 193, and a plurality of sixth conductive via structures 195. The second insulating layer 198 has a second upper surface 198*a* and a second lower surface 198*b* opposite to each other. The first patterned circuit layer 192 is disposed on the second upper surface 198*a* of the second insulating layer 198 and directly contacts the core layer 180. The third conductive via structures 185 are electrically connected to the second patterned conductive layer 170 and the first patterned circuit layer 192. The second patterned circuit layer 194 is disposed inside the second insulating layer 198. The third patterned conductive layer 196 is disposed on the second lower surface 198*b* of the second insulating layer 198. The fourth conductive via structures 191 are disposed inside the second insulating layer 198 and electrically connected to the first patterned circuit layer 192 and the second patterned circuit layer 194. The fifth conductive via structures 193 are disposed inside the second insulating layer 198 and electrically connected to the second patterned circuit layer 194 and the third patterned circuit layer 196. The sixth conductive via structures 195 are disposed inside the second insulating layer 198 and electrically connected to the first patterned circuit layer 192 and the third patterned circuit layer 196. The build-up structure BL2 is embodied as a circuit structure layer.

In terms of manufacturing process, please refer to FIG. 1E and FIG. 3*together*. After manufacturing of the chip package structure 100*a* illustrated in FIG. 1E, the build-up structure BL2 is provided. Then, the core substrate C is provided. The core substrate C includes the core layer 180 and the plurality of third conductive via structures 185 that pass through the core layer 180. Subsequently, the build-up structure BL2 and the core substrate C are bonded to enable the core layer 180 and the third conductive via structures 185 to directly contact the first patterned circuit layer 192 of the build-up structure BL2. Lastly, the second patterned conductive layer 170 of the chip package structure 100*a* is bonded onto the core substrate C, in which the core layer 180 is located between the build-up structure BL2 and the second patterned conductive layer 170, and the third conductive via structures 185 are electrically connected to the build-up structure BL2 and the second patterned conductive layer 170. Up to this point, manufacturing of the chip package structure 100*c* is completed.

In summary, in the design of the chip package structure of the disclosure, the first chip is electrically connected to the second chip through the first through silicon via, and the first chip is bonded onto the second chip through the first hybrid bonding pad, and the first insulating layer covers the first chip and the second chip. In other words, a bumpless state is achieved between the first chip and the second chip. The first chip and the second chip are embedded in the first insulating layer. Therefore, the chip package structure of the disclosure may have a very low profile, relatively low cost, relatively high density, and relatively high performance.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A chip package structure, comprising:

a first chip, having a plurality of first through silicon vias;

a second chip, directly disposed on the first chip, wherein the first chip is electrically connected to the second chip through the plurality of first through silicon vias;

a plurality of first hybrid bonding pads, formed between the first chip and the second chip, wherein the first chip is bonded onto the second chip through the plurality of first hybrid bonding pads;

a first insulating layer, covering the first chip and the second chip and having a first upper surface and a first lower surface opposite to each other;

a first patterned conductive layer, disposed on the first upper surface of the first insulating layer;

a second patterned conductive layer, disposed on the first lower surface of the first insulating layer;

a plurality of first conductive via structures, passing through the first insulating layer and electrically connected to the first patterned conductive layer and the second patterned conductive layer;

a plurality of second conductive via structures, disposed inside the first insulating layer and electrically connected to the first chip and the first patterned conductive layer;

a build-up structure; and a core substrate, comprising a core layer and a plurality of third conductive via structures, wherein the core layer is disposed between the build-up structure and the second patterned conductive layer, and the plurality of third conductive via structures pass through the core layer and are electrically connected to the build-up structure and the second patterned conductive layer, wherein the build-up structure comprises:

a third chip, having a plurality of second through silicon vias;

a fourth chip, directly disposed on the third chip, wherein the third chip is electrically connected to the fourth chip through the plurality of second through silicon vias;

a plurality of second hybrid bonding pads, formed between the third chip and the fourth chip, wherein the third chip is bonded onto the fourth chip through the plurality of second hybrid bonding pads;

a second insulating layer, covering the third chip and the fourth chip and having a second upper surface and a second lower surface opposite to each other;

a third patterned conductive layer, disposed on the second upper surface of the second insulating layer;

a fourth patterned conductive layer, disposed on the second lower surface of the second insulating layer and directly contacting the core layer, wherein the plurality of third conductive via structures are electrically connected to the second patterned conductive layer and the fourth patterned conductive layer;

a plurality of fourth conductive via structures, passing through the second insulating layer and electrically connected to the third patterned conductive layer and the fourth patterned conductive layer; and a plurality of fifth conductive via structures, disposed inside the second insulating layer and electrically connected to the third chip and the third patterned conductive layer.

2. The chip package structure according to claim 1, wherein the first chip has a first surface, the second chip has a second surface, and the first surface directly contacts the second surface.

3. The chip package structure according to claim 1, wherein a thickness of the core substrate is greater than a thickness of the build-up structure.

4. The chip package structure according to claim 1, further comprising:

a die attach film, disposed between the second chip and the second patterned conductive layer, wherein the second chip is fixed onto the second patterned conductive layer through the die attach film.

5. A chip package structure, comprising:

a first chip, having a plurality of first through silicon vias;

a second chip, directly disposed on the first chip, wherein the first chip is electrically connected to the second chip through the plurality of first through silicon vias;

a plurality of first hybrid bonding pads, formed between the first chip and the second chip, wherein the first chip is bonded onto the second chip through the plurality of first hybrid bonding pads;

a first insulating layer, covering the first chip and the second chip and having a first upper surface and a first lower surface opposite to each other;

a first patterned conductive layer, disposed on the first upper surface of the first insulating layer;

a second patterned conductive layer, disposed on the first lower surface of the first insulating layer;

a plurality of first conductive via structures, passing through the first insulating layer and electrically connected to the first patterned conductive layer and the second patterned conductive layer;

a plurality of second conductive via structures, disposed inside the first insulating layer and electrically connected to the first chip and the first patterned conductive layer;

a build-up structure; and a core substrate, comprising a core layer and a plurality of third conductive via structures, wherein the core layer is disposed between the build-up structure and the second patterned conductive layer, and the plurality of third conductive via structures pass through the core layer and are electrically connected to the build-up structure and the second patterned conductive layer, wherein the build-up structure comprises:

a second insulating layer, having a second upper surface and a second lower surface opposite to each other;

a first patterned circuit layer, disposed on the second upper surface of the second insulating layer and directly contacting the core layer, wherein the plurality of third conductive via structures are electrically connected to the second patterned conductive layer and the first patterned circuit layer;

a second patterned circuit layer, disposed inside the second insulating layer;

a third patterned circuit layer, disposed on the second lower surface of the second insulating layer;

a plurality of fourth conductive via structures, disposed inside the second insulating layer and electrically connected to the first patterned circuit layer and the second patterned circuit layer;

a plurality of fifth conductive via structures, disposed inside the second insulating layer and electrically connected to the second patterned circuit layer and the third patterned circuit layer; and a plurality of sixth conductive via structures, disposed inside the second insulating layer and electrically connected to the first patterned circuit layer and the third patterned circuit layer.

6. The chip package structure according to claim 5, wherein the first chip has a first surface, the second chip has a second surface, and the first surface directly contacts the second surface.

7. The chip package structure according to claim 5, wherein a thickness of the core substrate is greater than a thickness of the build-up structure.

8. The chip package structure according to claim 5, further comprising:

a die attach film, disposed between the second chip and the second patterned conductive layer, wherein the second chip is fixed onto the second patterned conductive layer through the die attach film.

* * * * *